(12) United States Patent
Takamine (10) Patent No.: US 7,479,852 B2
(45) Date of Patent: Jan. 20, 2009

(54) METHOD FOR MANUFACTURING SURFACE ACOUSTIC WAVE DEVICE AND SURFACE ACOUSTIC WAVE DEVICE

(75) Inventor: Yuichi Takamine, Ishikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/118,845

(22) Filed: May 12, 2008

(65) Prior Publication Data

US 2008/0204167 A1 Aug. 28, 2008

Related U.S. Application Data

(63) Continuation of application No. PCT/JP2006/320182, filed on Oct. 10, 2006.

(30) Foreign Application Priority Data

Nov. 14, 2005 (JP) ............................. 2005-329158

(51) Int. Cl.
  $H03H\ 9/145$ (2006.01)
  $H03H\ 3/08$ (2006.01)
  $H03H\ 9/64$ (2006.01)

(52) U.S. Cl. ......................... 333/193; 29/25.35; 29/594; 29/846

(58) Field of Classification Search .................. 333/193, 333/195; 29/25.35, 594, 846, 847; 310/313 B
See application file for complete search history.

(56) References Cited

U.S. PATENT DOCUMENTS

| | | | | |
|---|---|---|---|---|
| 6,404,303 | B1 * | 6/2002 | Kuroda | ....................... 333/193 |
| 6,879,086 | B2 | 4/2005 | Takamine | |
| 6,930,570 | B2 | 8/2005 | Nakamura et al. | |
| 7,075,391 | B2 | 6/2006 | Nakamura et al. | |
| 7,209,018 | B2 | 4/2007 | Nakao et al. | |
| 7,295,089 | B2 | 11/2007 | Shibahara et al. | |
| 7,345,400 | B2 | 3/2008 | Nakao et al. | |
| 2004/0174090 | A1 | 9/2004 | Koshido | |

FOREIGN PATENT DOCUMENTS

| | | |
|---|---|---|
| JP | 05-167387 A | 7/1993 |
| JP | 07-030362 A | 1/1995 |
| JP | 2000-049567 A | 2/2000 |
| JP | 2000-138553 A | 5/2000 |
| JP | 2005-210475 A | 8/2005 |

OTHER PUBLICATIONS

Official communication issued in the International Application No. PCT/JP2006/320182, mailed on Jan. 16, 2007.

* cited by examiner

*Primary Examiner*—Barbara Summons
(74) *Attorney, Agent, or Firm*—Keating & Bennett, LLP (57) ABSTRACT

A method for manufacturing a surface acoustic wave device includes the steps of forming an IDT electrode, a first wiring pattern, and a third wiring pattern on a piezoelectric substrate, forming an insulating film covering the IDT electrode and the wiring patterns, forming a photosensitive resin film, obtaining the photosensitive resin film, and forming a second wiring pattern on an insulating layer composed of the insulating film and the photosensitive resin film laminated on the insulating film so that the second wiring pattern three-dimensionally crosses the first wiring pattern.

10 Claims, 8 Drawing Sheets

FIG. 10
Prior Art ically allocated. A surface acoustic wave filter is widely used as a band-pass filter of an RF stage in a portable telephone. Since the transmitting frequency band and the receiving frequency band are closely allocated, the surface acoustic wave filter used for the band-pass filter of the RF stage in a portable telephone is required to have a good frequency temperature characteristic, in particular, to have a small change in frequency with temperature.

METHOD FOR MANUFACTURING SURFACE ACOUSTIC WAVE DEVICE AND SURFACE ACOUSTIC WAVE DEVICE

BACKGROUND OF THE INVENTION

1. Field of the Invention

The present invention relates to a surface acoustic wave device having an interdigital transducer (IDT) electrode and a $SiO_2$ film for improving temperature characteristics on a piezoelectric substrate and to a method for manufacturing the same. More specifically, the present invention relates to a method for manufacturing a surface acoustic wave device, which includes a step of forming a wiring pattern on a piezoelectric substrate, and also relates to a surface acoustic wave device having an improved wiring pattern structure on the piezoelectric substrate.

2. Description of the Related Art

A transmitting frequency band of a portable telephone and a receiving frequency band thereof are closely allocated. A surface acoustic wave filter is widely used as a band-pass filter of an RF stage in a portable telephone. Since the transmitting frequency band and the receiving frequency band are closely allocated, the surface acoustic wave filter used for the band-pass filter of the RF stage in a portable telephone is required to have a good frequency temperature characteristic, in particular, to have a small change in frequency with temperature.

According to such a requirement, for example, Japanese Unexamined Patent Application Publication No. 2004-254291 discloses a structure in which a film for improving frequency temperature characteristics made of $SiO_2$ is formed on a piezoelectric substrate. As shown in a plan view of FIG. 7A and a cross-sectional view of FIG. 7B that is taken along line A-A of FIG. 7A, a surface acoustic wave filter 101 includes an IDT electrode 103 and reflectors 104 and 105 provided on a piezoelectric substrate 102. A $SiO_2$ film 106 covers the IDT electrode 103 and the reflectors 104 and 105.

In order to electrically connect the IDT electrode 103 to the outside, a hole must be provided in the $SiO_2$ film and an exposed portion of the electrode in the hole is electrically connected to the outside using a bonding wire or other suitable connection structure.

Recently, the circuit structure of surface acoustic wave filter devices has become very complicated. That is, in order to magnify an attenuation function or achieve a balance-unbalance conversion function, the surface acoustic wave devices include structures in which a plurality of surface acoustic wave filters are connected or a surface acoustic wave filter is connected to a surface acoustic wave resonator.

Figure 8:
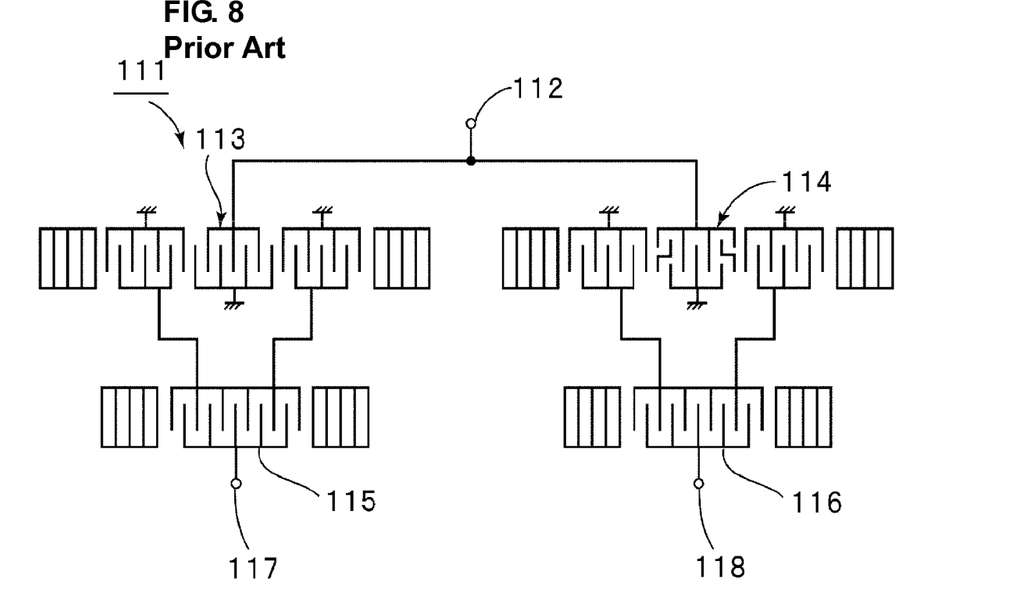
FIG. 8 is a schematic circuit diagram showing a circuit structure of the existing surface acoustic wave filter.

For example, Japanese Unexamined Patent Application Publication No. 2004-282707 discloses a surface acoustic wave filter device having a circuit structure shown in FIG. 8. As shown in FIG. 8, in a surface acoustic wave filter device 111, a first and a second longitudinally coupled resonator surface acoustic wave filters 113 and 114 are connected to an unbalanced terminal 112 in parallel. The longitudinally coupled resonator surface acoustic wave filter 113 is connected to a balanced terminal 117 through a one port surface acoustic wave resonator 115. The second longitudinally coupled resonator surface acoustic wave filter 114 is connected to a second balanced terminal 118 through a one port surface acoustic wave resonator 116.

Figure 9:
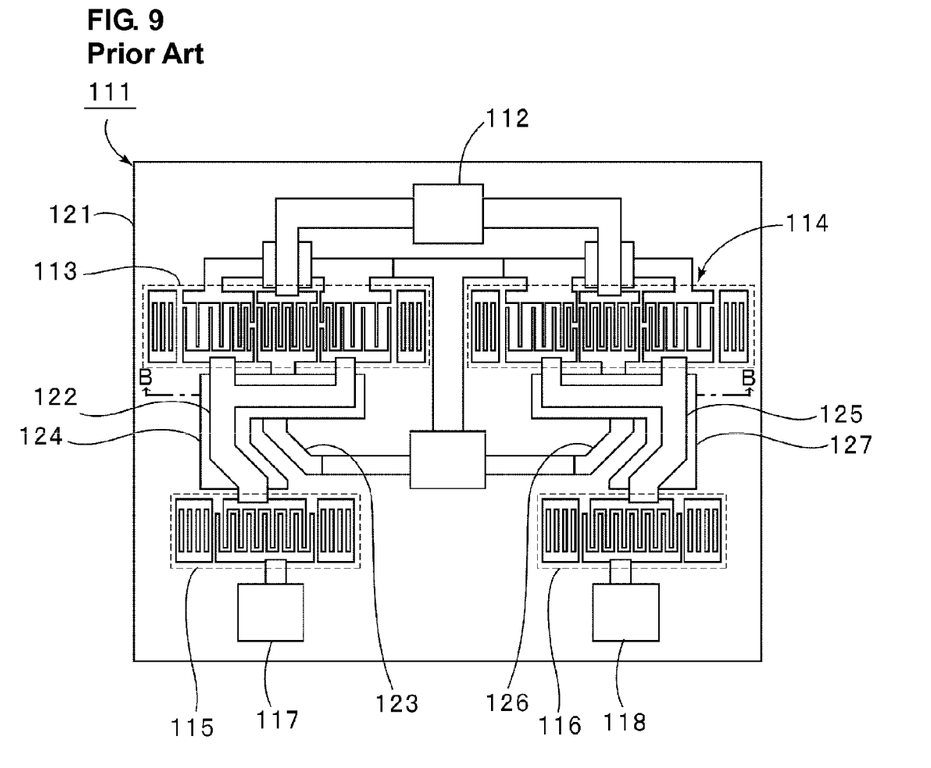
FIG. 9 is a schematic plan view of the existing surface acoustic wave filter.

Japanese Unexamined Patent Application Publication No. 2004-282707 discloses a wiring pattern for achieving the above-mentioned circuit structure, which is shown in FIG. 9 as a schematic plan view. According to the schematic plan view, a piezoelectric substrate 121 includes the unbalanced terminal 112, the first and the second balanced terminals 117 and 118, the first and the second longitudinally coupled resonator surface acoustic wave filters 113 and 114, the one port surface acoustic wave resonators 115 and 116 provided thereon and these components are connected with each other using wiring patterns.

If the wiring patterns are arranged to provide the connection, the wiring patterns which are connected to different potentials may cross each other. For example, in FIG. 9, a wiring pattern 122 electrically connecting the first longitudinally coupled resonator surface acoustic wave filter 113 to the one port surface acoustic wave resonator 115 is crossed with a wiring pattern 123 connecting the central IDT of the longitudinally coupled resonator surface acoustic wave filter 113 to the ground potential. In this case, in order to prevent a short circuit between the wiring patterns 122 and 123, an insulating layer 124 made of a photosensitive resin is provided therebetween.

Similarly, a wiring pattern 125 connecting the second longitudinally coupled resonator surface acoustic wave filter 114 to the one port surface acoustic wave resonator 116 and the wiring pattern 126 connecting the central IDT of the second longitudinally coupled resonator surface acoustic wave filter to a ground potential are three-dimensionally crossed with each other with an insulating layer 127 made of a photosensitive resin provided therebetween.

Figure 10:
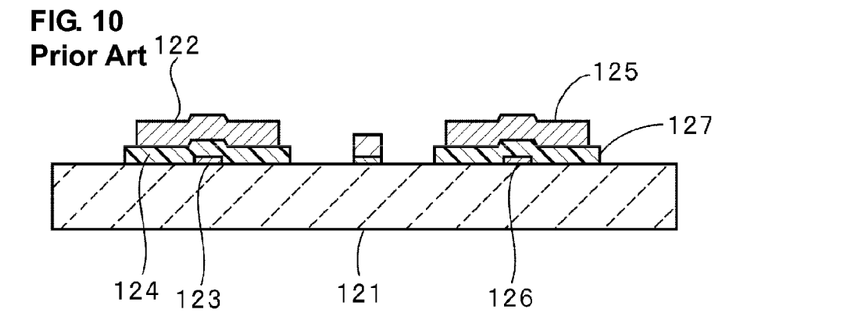
FIG. 10 is a cross-sectional view taken along line B-B of FIG. 9.

FIG. 10 is a cross-sectional view of the three-dimensional crossing portion taken along line B-B in FIG. 9.

As clearly shown in FIG. 9, the surface acoustic wave filter device 111 has, as mentioned above, the wiring patterns 123 and 126 connected to the ground potential, the wiring patterns 122 and 125 electrically connecting the surface acoustic wave filter to the surface acoustic wave resonator, and the wiring patterns connecting the unbalanced terminal and the first and the second balanced terminals to other electrode portions. These wiring patterns provided on the piezoelectric substrate 121 make the structure thereof complicated. Therefore, the above-mentioned three-dimensional crossing portions are formed at several positions.

Figure 7A:
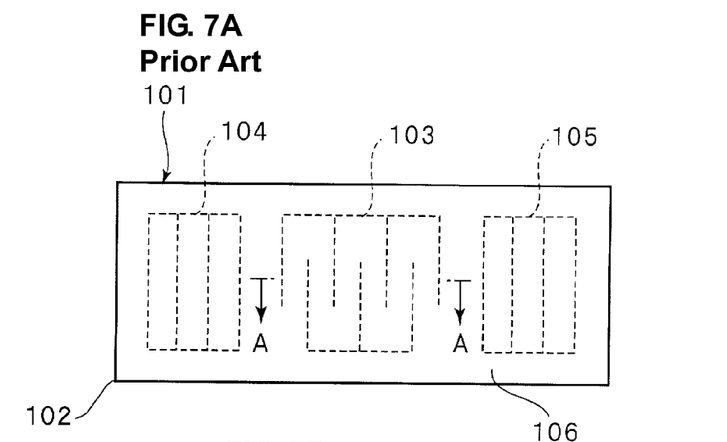
FIGS. 7A and 7B are a plan view and a cross-sectional view taken along line A-A of FIG. 7A showing an example of existing surface acoustic wave filters.
Figure 7B:
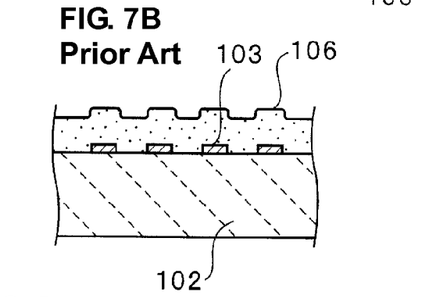

As mentioned above, the surface acoustic wave filter described in Japanese Unexamined Patent Application Publication No. 2004-254291 includes the $SiO_2$ film 106 covering the IDT electrode on the piezoelectric substrate in order to improve the frequency temperature characteristic.

On the contrary, the surface acoustic wave filter device 111 described in Japanese Unexamined Patent Application Publication No. 2004-282707 includes the insulating layers 124 and 127 made of photosensitive resin, which are formed by photolithography. These insulating layers are formed to prevent short circuiting between the wiring patterns at the crossing portions of the wiring patterns on the piezoelectric substrate, in particular, at the crossing portions where the wiring patterns connected to different potentials cross each other.

Therefore, in the surface acoustic wave filter device used in a RF stage of a portable telephone, a $SiO_2$ film is preferably provided to improve a frequency temperature characteristic, and if the wiring patterns become complicated, an insulating layer for preventing short circuiting between wiring patterns should be formed thereon in addition to the $SiO_2$ film by patterning photosensitive resin layer. This complicates the manufacturing process of surface acoustic wave devices and the cost thereof is significantly increased.

Furthermore, when the photosensitive resin is applied and then patterned, the photosensitive resin must be heated to a high temperature in order to be cured. This also leads to deterioration of the surface of the piezoelectric substrate caused by the high temperature, and the desired characteristics are rarely obtained.

Furthermore, if the IDT electrodes are made of corrodable metals such as Cu, the IDT electrodes are easily corroded by a developer used for patterning of the photosensitive resin.

SUMMARY OF THE INVENTION

To overcome the problems described above, preferred embodiments of the present invention provide a method for manufacturing a surface acoustic wave device and the surface acoustic wave device, in which a $SiO_2$ film for improving the frequency temperature characteristic is formed, the production process is relatively simple, deterioration of the characteristics of the piezoelectric substrate caused by heat treatment in the manufacturing process is prevented, and corrosion of the IDT electrodes is prevented in the manufacturing process even when the IDT electrodes are made of a corrodable metal.

Additional preferred embodiments of the present invention provide a method for manufacturing a surface acoustic wave device and the surface acoustic wave device having a plurality of wiring patterns connected to different potentials, which form a three-dimensional crossing structure having an insulating layer therebetween to prevent short circuiting between the plurality of wiring patterns and to facilitate high density of the wiring patterns and a compact size of the entire device.

A preferred embodiment of the present invention provides a method for manufacturing a surface acoustic wave device including the steps of forming an IDT electrode and a first wiring pattern on a piezoelectric substrate, forming an insulating film covering the IDT electrode and the first wiring pattern on a piezoelectric substrate after forming the IDT electrode and the first wiring pattern, applying a photosensitive resin on the insulating film so as to form a photosensitive resin layer, patterning the photosensitive resin layer, etching a portion of the insulating film such that the insulating film remains on the IDT electrode, and forming a second wiring pattern on an insulating layer composed of the insulating film and the photosensitive resin film provided on the insulating film in a region other than a region where the IDT electrode is provided.

Preferably, the second wiring pattern is connected to a potential that is different from a potential to which the first wiring pattern is connected, and the first and the second wiring patterns are arranged so that the second wiring pattern is three-dimensionally crossed with the first wiring pattern with the insulating film interposed therebetween.

The method preferably further includes the steps of forming a third wiring pattern in the step of forming the IDT electrode and the first wiring pattern on the piezoelectric substrate, forming the insulating film so as also to cover the third wiring pattern in the step of forming the insulating film covering the IDT electrode and the first wiring pattern, forming a hole so as to expose a portion of the third wiring pattern in the step of etching a portion of the insulating film, and forming a fourth wiring pattern electrically connected to the third wiring pattern in the hole and extending to the insulating layer composed of the insulating film around the hole and the photosensitive resin film laminated on the insulating film.

The insulating film is preferably a $SiO_2$ film, and is preferably formed to improve a frequency temperature characteristic thereof.

A surface acoustic wave device according to another preferred embodiment of the present invention includes a piezoelectric substrate, at least one IDT electrode provided on the piezoelectric substrate, a first wiring pattern provided on the piezoelectric substrate, an insulating film arranged to cover the IDT electrode and the first wiring pattern, and a photosensitive resin film provided on the insulating film over the first wiring pattern but not on the IDT electrode, wherein a second wiring pattern is provided on the insulating layer having a lamination structure including the insulating film and the photosensitive resin film.

Preferably, the second wiring pattern is connected to a potential that is different from a potential to which the first wiring pattern is connected, and is arranged so that the second wiring pattern is three-dimensionally crossed with the first wiring pattern with the insulating layer interposed therebetween. Therefore, short circuiting between the first and the second wiring pattern ICs can be securely prevented and, for surface acoustic wave devices having a plurality of wiring patterns, high density wiring patterns and a compact size of the surface acoustic wave devices are facilitated.

The surface acoustic wave device preferably further includes a third wiring pattern on the piezoelectric substrate, wherein a portion of the third wiring pattern is exposed in a hole provided in the insulating film, and a fourth wiring pattern electrically connected to the third wiring pattern in the hole and extending over the insulating layer.

The insulating film is preferably a $SiO_2$ film, and is preferably formed to improve a frequency temperature characteristic thereof.

In the method for manufacturing a surface acoustic wave device according to preferred embodiments of the present invention, an IDT electrode and a first wiring pattern are formed on a piezoelectric substrate having a negative frequency temperature characteristic. Then, an insulating film is disposed thereon, and a photosensitive resin is applied on the insulating film to form a photosensitive resin layer. After patterning the photosensitive resin layer, the insulating film is partially etched so that the insulating film remains over the IDT electrode. Then, in regions other than the region where IDT electrodes are formed and at the portion where an insulating layer composed of the insulating film and the photosensitive resin film on the insulating film is provided, a second wiring pattern connected to a potential that is different from that of the first wiring pattern is formed on the insulating layer.

Accordingly, since the first and the second wiring patterns are separated by the insulating layer composed of the insulating film and the photosensitive resin film, short circuiting between the first and the second wiring patterns can be securely prevented.

In addition, since the insulating film covers the IDT electrode, the frequency temperature characteristic of the surface acoustic wave device can be improved.

Furthermore, the manufacturing process can be simplified because the second wiring pattern is formed on the insulating layer in the regions other than the region where IDT electrodes are formed after patterning the photosensitive resin film and partially etching the insulating film so that an insulating film remains on the IDT electrode.

Furthermore, even if the IDT electrode is made of a corrodable metal material such as Cu, since the IDT electrode is covered by the insulating film, the IDT electrode is not exposed to a developer for forming the photosensitive resin layer. Therefore, the corrosion of the IDT electrode is prevented.

Where the first and the second wiring patterns are arranged to cross each other three dimensionally with the insulating film therebetween, short circuiting can be securely prevented at the portion where the first and the second wiring patterns cross each other.

Where the insulating film also covers a third wiring pattern, a hole is formed by partial etching in the insulating film to partially expose the third wiring pattern, a fourth wiring pattern is electrically connected to the third wiring pattern in the hole, and the fourth wiring pattern is extended over the insulating layer around the hole. The third wiring pattern can be extracted to the outside via the fourth wiring pattern. Therefore, by forming the third wiring pattern connected to the IDT electrode, the IDT electrode can be electrically connected to the outside via the fourth wiring pattern.

When the insulating film is a $SiO_2$ film, the $SiO_2$ film has a positive frequency temperature characteristic. Therefore, if the piezoelectric substrate is a material having a negative frequency temperature characteristic, the frequency temperature characteristic of the surface acoustic wave device can be improved by using a $SiO_2$ film as the insulating film.

Where the insulating film is formed to improve the frequency temperature characteristic, by using the insulating film, not only can the insulation between the wiring patterns be provided, but the frequency temperature characteristic of the surface acoustic wave device can also be improved.

In the surface acoustic wave device according to preferred embodiments of the present invention, if the insulating film is arranged to cover the IDT electrode provided on the piezoelectric substrate having a negative frequency temperature characteristic, the frequency temperature characteristic can be improved. In addition, in a region other than the region where the insulating film is provided, if an insulating layer composed of an insulating film and a photosensitive resin film is provided over a first wiring pattern and a second wiring pattern connected to a potential that is different from that of the first wiring pattern is provided on the insulating layer, short circuiting between the first and the second wiring patterns can be securely prevented.

In addition, since the IDT electrode is covered with the insulating film, if the photosensitive resin film is provided on the insulating film, the IDT electrode is not directly exposed to the developer, which is used to pattern the photosensitive resin film. Therefore, even if the IDT electrode is made of a corrodable metal such as Cu, the corrosion of the IDT electrode can be securely prevented.

Where a third wiring pattern is partially exposed in a hole provided in the insulating film, the third wiring pattern is electrically connected to the fourth wiring pattern in the hole, and if the fourth wiring pattern extends over the insulating layer, the surface acoustic wave device can be easily connected to the outside via the third wiring pattern and the fourth wiring pattern.

Where the insulating film is a $SiO_2$ film, the $SiO_2$ film has a positive frequency temperature characteristic. Therefore, if the piezoelectric substrate is a material having a negative frequency temperature characteristic, the frequency temperature characteristic of the surface acoustic wave device can be improved by using a $SiO_2$ film as the insulating film.

Where the insulating film is provided to improve the frequency temperature characteristic, by using the insulating film, not only can the insulation between the wiring patterns be provided, but the frequency temperature characteristic of the surface acoustic wave device can also be improved.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

With reference to drawings, preferred embodiments of the present invention are described below.

Figure 1:
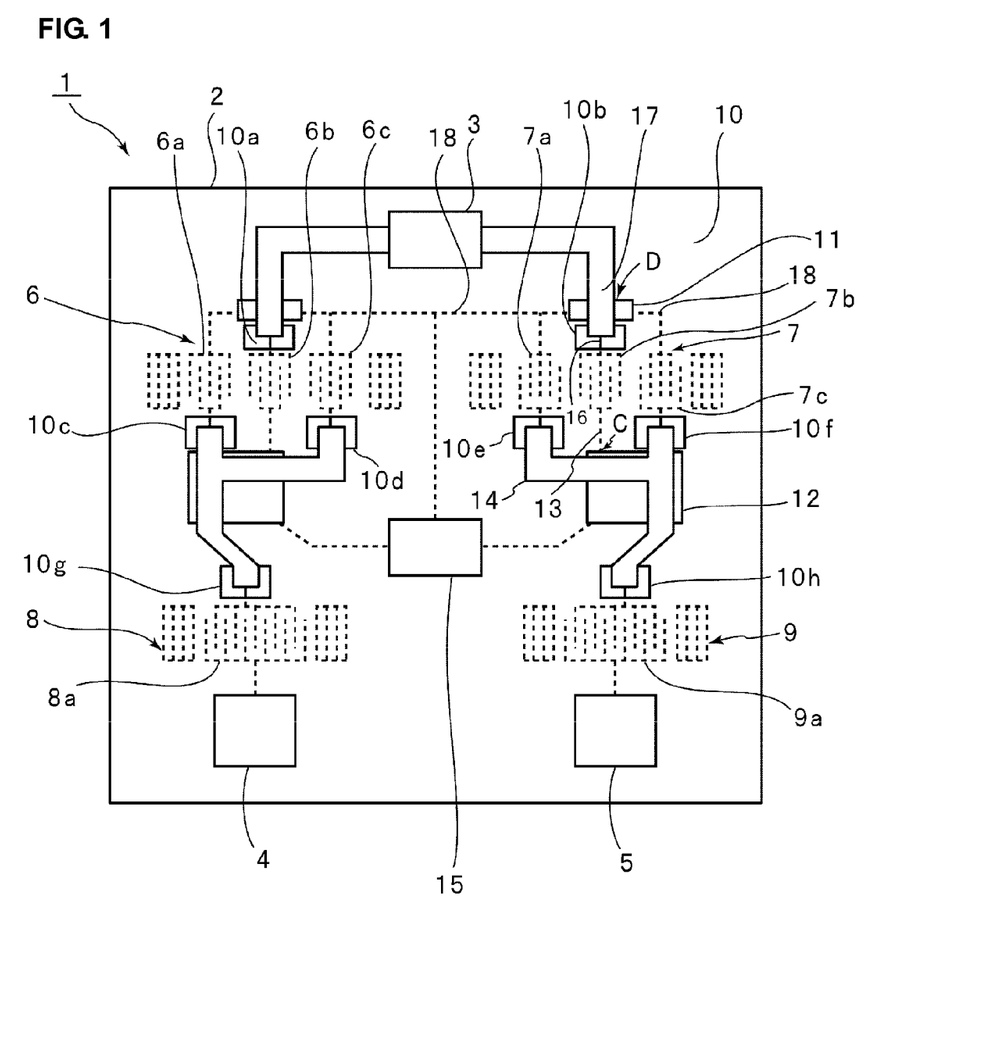
FIG. 1 is a schematic plan view of a surface acoustic wave filter device according to a preferred embodiment of the present invention.

FIG. 1 is a schematic plan view showing an electrode structure of a surface acoustic wave filter device according to a preferred embodiment of the present invention. A surface acoustic wave filter 1 includes a piezoelectric substrate 2 having a negative frequency temperature characteristic. In the present preferred embodiment, a piezoelectric single-crystal substrate, such as $LiTaO_3$ or $LiNbO_3$, is used as the piezoelectric substrate 2 having the negative frequency temperature characteristic. Alternatively, the piezoelectric substrate 2 may be made of a piezoelectric ceramic.

$LiTaO_3$ and $LiNbO_3$ have a negative frequency temperature characteristic and a $SiO_2$ film described below has a positive frequency temperature characteristic. By providing the $SiO_2$ film, the frequency temperature characteristic can be improved.

An electrode pad defining an unbalanced terminal 3 and electrode pads defining first and second balanced terminals 4 and 5, respectively, are provided on the piezoelectric substrate 2.

First and second longitudinally coupled resonator surface acoustic wave filters 6 and 7 are connected to the unbalanced terminal 3 in parallel.

The first longitudinally coupled resonator surface acoustic wave filter 6 is electrically connected to the first balanced terminal 4 through a one port surface acoustic wave resonator 8. On the other hand, the second longitudinally coupled resonator surface acoustic wave filter 7 is electrically connected to the second balanced terminal 5 through a one port surface acoustic wave resonator 9.

Since the first longitudinally coupled resonator surface acoustic wave filter 6 and the second longitudinally coupled resonator surface acoustic wave filter 7 have phases that are inverted by 180°, the surface acoustic wave filter 1 has a balance-unbalance conversion function.

Furthermore, in the surface acoustic wave filter device 1 of the present preferred embodiment, most of the region of the piezoelectric substrate 2 is covered with a $SiO_2$ film 10. The $SiO_2$ film 10 includes holes 10a to 10h which are formed by etching.

The $SiO_2$ film 10 has a positive frequency temperature characteristic. Therefore, if the $SiO_2$ film 10 is arranged so as to cover IDT electrodes 6a to 6c and 7a to 7c defining the longitudinally coupled resonator surface acoustic wave filters 6 and 7, and IDT electrodes 8a and 9a defining the surface acoustic wave resonators 8 and 9, respectively, the frequency temperature characteristic can be improved. Here, the $SiO_2$ film may be used not only to improve the frequency temperature characteristic but also to control the frequency.

In the surface acoustic wave filter device, the first and the second longitudinally coupled resonator surface acoustic wave filters 6 and 7 have a plurality of IDT electrodes 6a to 6c and 7a to 7c, respectively. Furthermore, the first and second longitudinally coupled resonator surface acoustic wave filters 6 and 7 are electrically connected to the surface acoustic wave resonators 8 and 9, respectively. Therefore, as shown in the FIG. 1, a plurality of wiring patterns are provided to achieve the complicated electrical connection. Furthermore, wiring patterns connected to different electric potentials should be electrically isolated from one another. One of the characteristics of the present preferred embodiment is that the electrical isolation is performed using the above-mentioned $SiO_2$ film 10 that is provided to improve the frequency temperature characteristic. This will be described with reference to FIG. 1 in which three-dimensional crossing portions are indicated by arrows C and D.

Furthermore, as shown in FIG. 1, photosensitive resin films 11 and 12 are laminated on a portion of the $SiO_2$ film 10. In the present preferred embodiment, the portions in which the photosensitive resin films 11 and 12 are laminated on the $SiO_2$ film 10 are referred to as an insulating layer having a $SiO_2$ film and photosensitive resin films 11 and 12 laminated on the $SiO_2$ film.

Figure 2A:
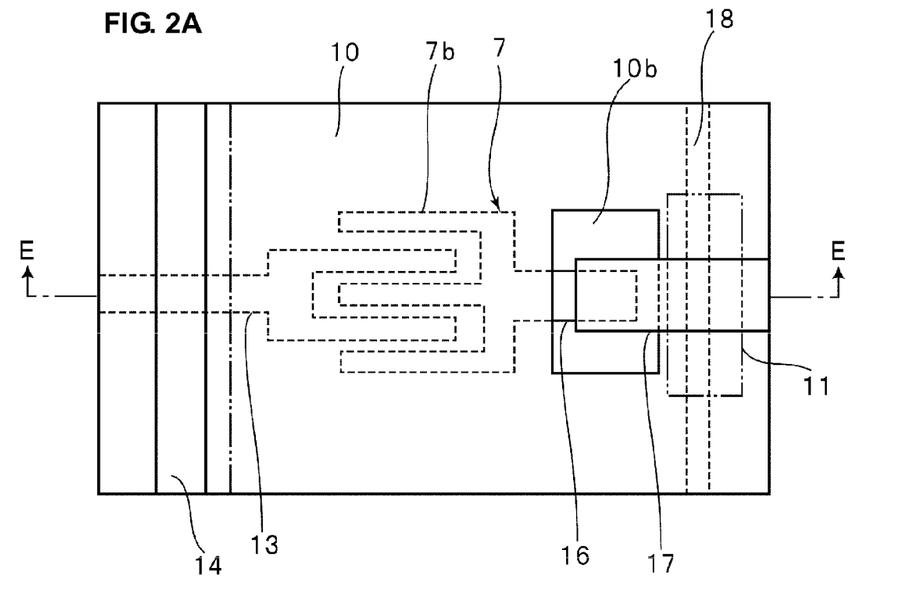
FIGS. 2A and 2B are an enlarged partial plan view and a cross-sectional view taken along line E-E of FIG. 2A of a main portion of the surface acoustic wave filter device according to a preferred embodiment of the present invention.
Figure 2B:
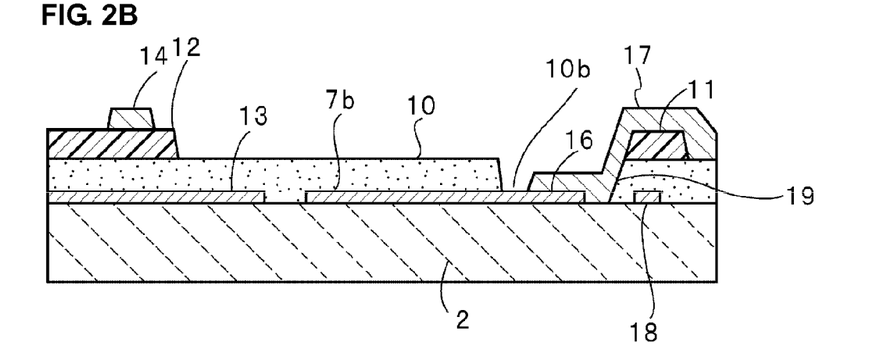

FIG. 2A is an enlarged partial plan view showing the portions indicated by arrows C and D. FIG. 2B is a cross-sectional view taken along line E-E in FIG. 2A.

A first wiring pattern 13 is electrically connected to an end of an IDT electrode 7b provided at the approximate center of the longitudinally coupled resonator surface acoustic wave filter 7. The wiring pattern 13 is electrically connected to an electrode pad 15 shown in FIG. 1. The electrode pad 15 is an electrode pad connected to the ground potential. On the other hand, as shown in FIG. 1, the second wiring pattern 14 commonly connects one end of each of the IDT electrodes 7a and 7c and is electrically connected to a one port surface acoustic wave resonator 9. This wiring pattern 14 represents a second wiring pattern. The second wiring pattern 14 is formed on the $SiO_2$ film 10. As clearly shown in FIG. 1, at the three-dimensional crossing portion indicated by an arrow C, the second wiring pattern 14 is formed on an insulating layer composed of the $SiO_2$ film 10 and the photosensitive resin film 12 laminated on the $SiO_2$ film 10 and is three-dimensionally crossed with the first wiring pattern 13 with the insulating film interposed therebetween.

Therefore, since the second wiring pattern 14 connected to a potential different from that of the first wiring pattern 13 three-dimensionally crosses the first wiring pattern 13 with the above-mentioned insulating layer interposed therebetween, short circuiting between the first and the second wiring patterns 13 and 14, which are connected to different potentials, is prevented.

As shown in a manufacturing process described below, a photosensitive resin film 12 is cured by heating and formed by patterning with a developer. When the photosensitive resin film 12 is cured by heating, since the $SiO_2$ film 10 functions as a protective layer for the piezoelectric substrate, deterioration of the piezoelectric substrate 2 due to the above-mentioned heating is prevented. Additionally, when the photosensitive resin film 12 is formed by patterning with the developer, an IDT electrode 7b and the wiring pattern 13 are not directly exposed to the developer. Therefore, even if Cu, which is easily corroded, is used as a material for electrodes, corrosion of the IDT electrode 7b and the wiring pattern 13 is prevented.

On the other hand, at the portion indicated by an arrow D in FIG. 1, a hole 10b is formed in the $SiO_2$ film 10 by partial etching as described below. A third wiring pattern 16 connected to an end of the IDT electrode 7b is exposed in the hole 10b. The third wiring pattern 16 and the IDT electrode 7b are integral with one another. The third wiring pattern 16 may be made of a material which is different from that of the IDT electrode 7b.

In the hole 10b, a fourth wiring pattern 17 is formed so as to electrically connect to the exposed portion of the third wiring pattern 16. The fourth wiring pattern 17 extends from inside the hole 10b over the insulating layer composed of the $SiO_2$ film 10 and the photosensitive resin film 11 laminated thereon. Here, the cross-sectional shape 19 of the $SiO_2$ film and the photosensitive resin film, on which the wiring pattern 17 is disposed, is preferably a tapered shape in order to prevent the wiring pattern 16 from breaking. Under the insulating layer, a fifth wiring pattern 18 is provided. The fifth wiring pattern 18 commonly connects the IDT electrodes 7a and 7c and is electrically connected to the electrode pad 15 so that the fifth wiring pattern can be electrically connected to the ground potential. Therefore, the fifth wiring pattern 18 three-dimensionally crosses the fourth wiring pattern 17 with the above-mentioned insulating layer interposed therebetween.

In other words, the fourth wiring pattern 17 and the fifth wiring pattern 18 are electrically isolated by the insulating layer disposed therebetween, which is similar to the relationship of the above-mentioned first wiring pattern 13 and the second wiring pattern 14. Therefore, short circuiting between the fourth and the fifth wiring patterns 17 and 18 is prevented.

Additionally, the fourth wiring pattern 17 is electrically connected to the third wiring pattern 16 in the hole 10b and three-dimensionally crosses the fifth wiring pattern 18 so as to extend outside. Therefore, in the present preferred embodiment, the use of such a three-dimensional structure improves the wiring density of arranging the plurality of wiring patterns 16, 17, and 18, so that miniaturization of the surface acoustic wave device 1 is achieved.

Next, a specific preferred embodiment of the manufacturing method is described and the advantage of the present preferred embodiment is more specifically described.

A manufacturing process of the preferred embodiment is described with reference to FIG. 2A, which shows a representative portion, FIGS. 3A to 3F, and FIGS. 4A to 4F.

Figure 3A:
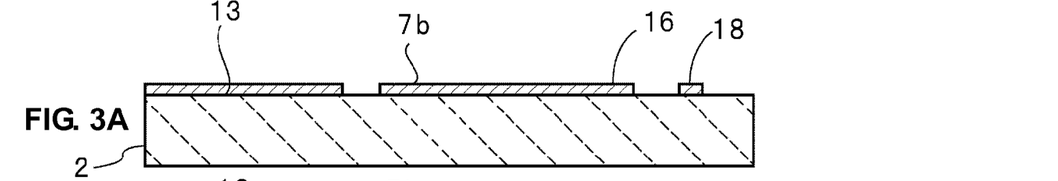
FIGS. 3A to 3F are partial elevational cross-sectional views showing each step of a method for manufacturing the surface acoustic wave filter device according to a preferred embodiment of the present invention.

First, as shown in FIG. 3A, electrodes including the IDT electrode 7b, the first wiring pattern 13, the third wiring pattern 16, and the fifth wiring pattern 18 are formed on the piezoelectric substrate 2 as the first layer electrodes. Materials of the electrodes are not particularly limited, and Al, Cu, and Au, and an alloy thereof can be appropriately used as the materials.

As described above, in the present preferred embodiment, since photosensitive resin films 11 and 12 do not contact electrodes formed thereunder, the electrodes formed in advance are not corroded by a developer used to form the photosensitive resin films 11 and 12. Therefore, a corrodable material, such as Cu, can be used as a material for the first layer electrodes. In such a case, since corrodable materials are relatively inexpensive, the cost of the surface acoustic wave device can be reduced.

Furthermore, the electrode is not necessarily composed of a single metal layer. The electrode may be a laminated metal film composed of the above-mentioned single metal layer and a Ti layer and/or a NiCr layer which are laminated in order to enhance an adhesion property and other properties thereof.

Furthermore, for an electrode defining a wiring pattern of the second layer and layers formed in subsequent steps described below, the same materials as those of the first layer electrodes can be used.

The IDT electrode and the wiring patterns 13, 16, and 18 shown in FIG. 3A are formed by disposing the above-mentioned metal material on the entire surface of a substrate and patterning the resulting film using a photolithography method and other suitable method. The method for forming the electrode is not limited to this method.

Figure 3B:
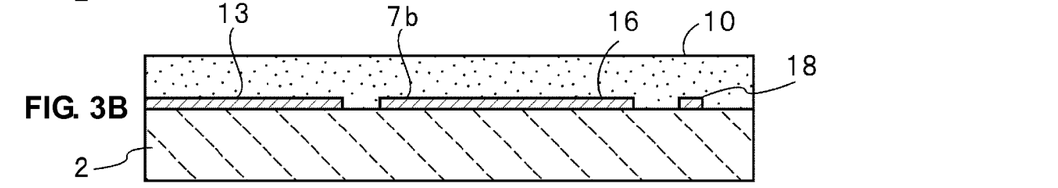

Next, as shown in FIG. 3B, the $SiO_2$ film 10 is disposed on the entire surface of the piezoelectric substrate 2. The $SiO_2$ film can be formed by any appropriate thin film forming method, such as vapor deposition or sputtering.

Figure 3C:
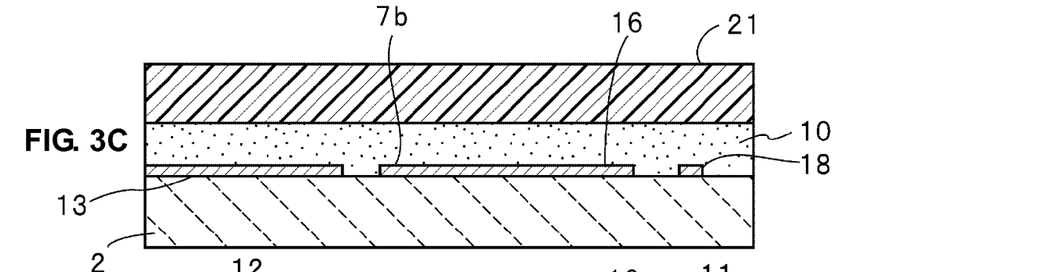

Next, as shown in FIG. 3C, a photosensitive resin layer 21 is formed on the entire surface of the $SiO_2$ film 10. Then, the photosensitive resin layer 21 is cured by heating. This heating is preferably performed at a temperature of about 250° C. to about 330° C., for example. A heating condition is, however, changed according to the composition of a resin material defining the photosensitive resin layer 21. However, since the $SiO_2$ film 10 is disposed between the photosensitive resin layer 21 and the piezoelectric substrate 2, if heating is performed, the piezoelectric substrate 2 is not deteriorates.

Figure 3D:
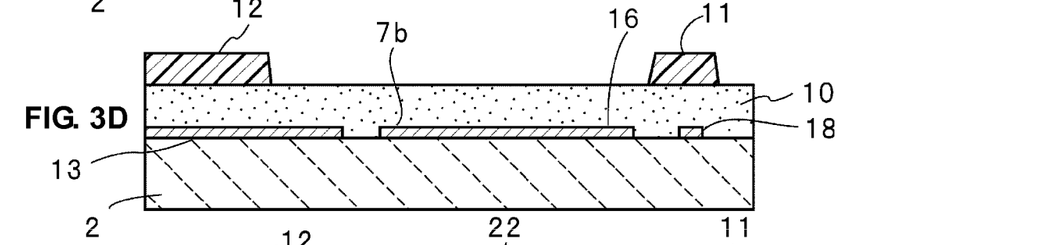

Next, as shown in FIG. 3D, the photosensitive resin layer 21 is patterned so as to form the photosensitive resin films 11 and 12. This patterning can be performed by radiating the photosensitive resin layer 21 and developing the same with a developer. As the developer, an alkaline developer or other suitable developer are used. The IDT electrode 7b and the wiring patterns 13, 16, and 18, which are formed under the photosensitive resin layer are not corroded when the developer is used. The reason for this is that since the IDT electrode 7b and the wiring patterns 13, 16, and 18 are disposed under the $SiO_2$ film 10. Thus, the IDT electrode 7b and the wiring patterns 13, 16, and 18 are not directly exposed to the developer. Therefore, as mentioned above, an inexpensive and corrodable metal, such as Cu, can be used as a material for electrodes.

Figure 3E:
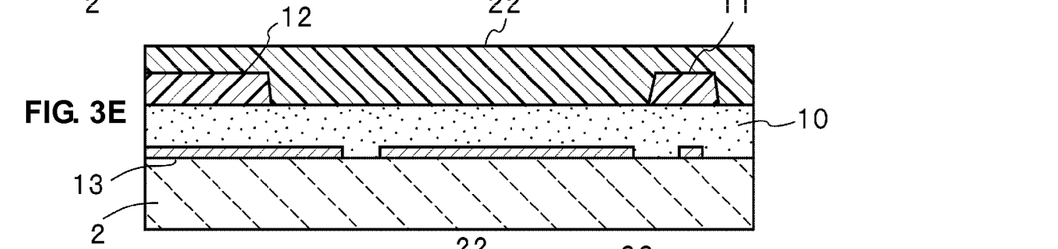
Figure 3F:
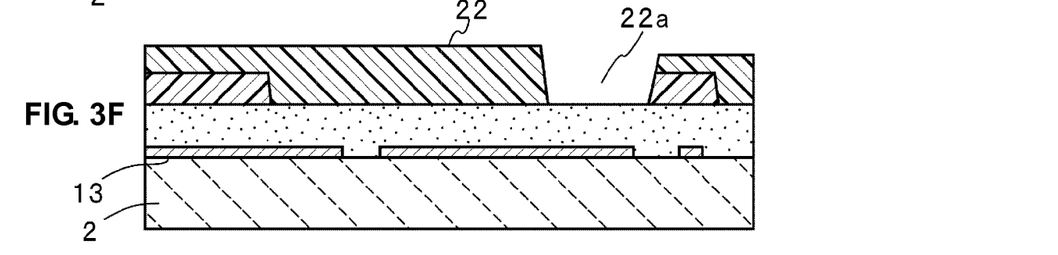
Figure 4A:
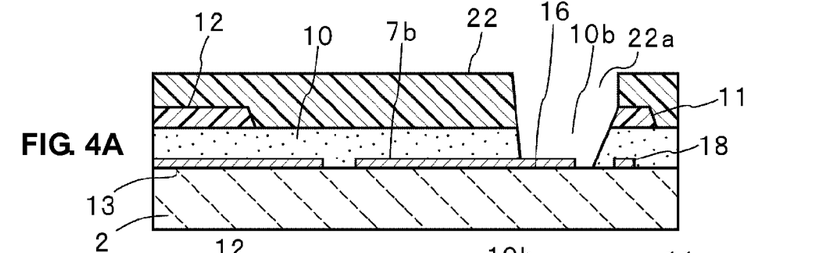
FIGS. 4A to 4F are partial elevational cross-sectional views showing each step of a method for manufacturing the surface acoustic wave filter device according to a preferred embodiment of the present invention.

Next, as shown in FIG. 3E, a positive photoresist layer 22 is disposed on the entire surface of the $SiO_2$ film. Then, the photoresist layer 22 is exposed to light through a mask having openings, which are provided at locations corresponding to the position of the holes 10b of the resulting substrate, and developed. As a result, as shown in FIG. 3F, a hole 22a is formed. Then, a portion of $SiO_2$ film exposed in the hole 22a is removed by dry etching. In this manner, as shown in FIG. 4A, a portion of the third wiring pattern 16 is exposed in the hole 10b.

Figure 4B:
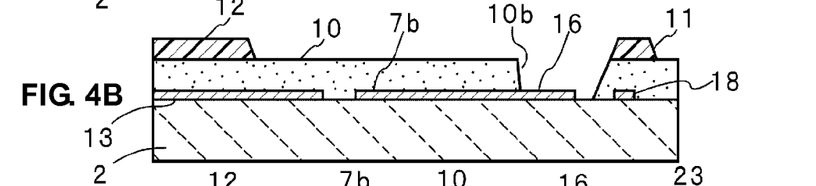
Figure 4C:
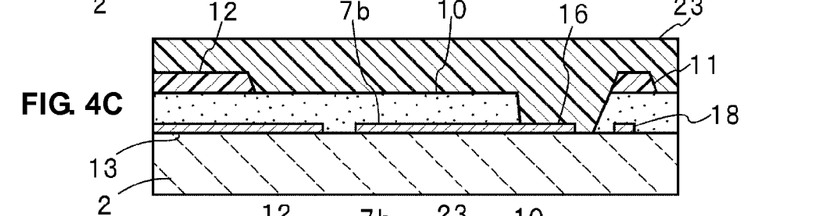

Next, as shown in FIG. 4B, the photoresist layer 22 is removed. Then, as shown in FIG. 4C, a negative photoresist layer 23 is disposed on the entire surface of the resulting substrate.

Figure 4D:
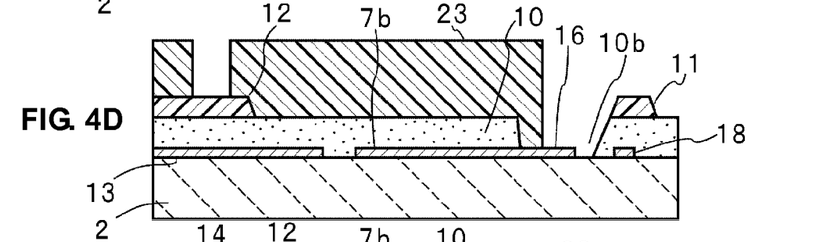

Then, the photoresist layer is exposed to light through a photomask having a portion covering locations at which the electrode is to be formed. Then, the unexposed portion of the resist is removed. In this manner, as shown in FIG. 4D, a portion of the photoresist layer 23 at which the electrode is to be formed, is removed.

Figure 4E:
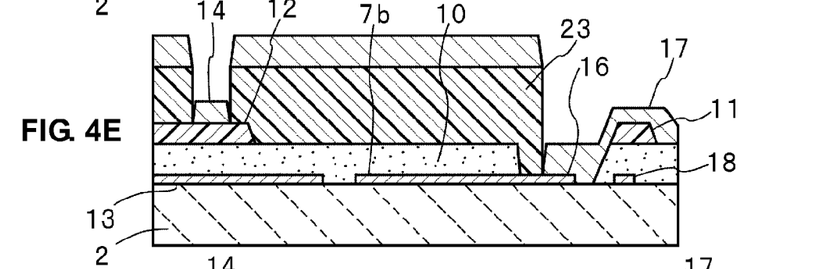
Figure 4F:
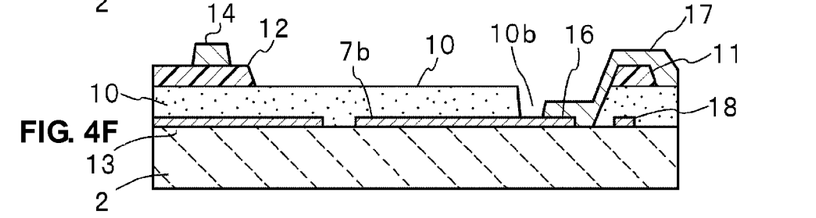

Then, as shown in FIG. 4E, an electrode material for the second layer electrode is formed into a film. This film formation using the electrode material may be conducted by an appropriate film forming method, such as vapor deposition or sputtering, as with the first layer electrodes. Then, as shown in FIG. 4F, the negative photoresist layer 23 is removed with the electrode material formed on the upper surface thereof by a lift-off technique. As a result, a surface acoustic wave device 1 is obtained.

As shown in FIGS. 3A to 3F and in FIGS. 4A to 4F, according to the manufacturing method of the present preferred embodiment, the surface acoustic wave device 1 can be obtained by forming and patterning the $SiO_2$ film 10 and by forming and patterning the photosensitive resin film. These are performed in addition to a step for forming various electrodes and wiring patterns using a photolithography technique. In this case, as mentioned above, the IDT electrode 7b and wiring patterns 13, 16, and 18, which were formed before the formation of the $SiO_2$ film 10, can be prevented from being exposed to a developer which is used in a step for forming the photosensitive resin films 11 and 12. Thus, the IDT electrode 7b can be formed with inexpensive electrode materials such as Cu and other suitable metals.

Furthermore, the $SiO_2$ film 10 improves a frequency temperature characteristic of the surface acoustic wave device. In addition, an insulating layer, which is composed of the $SiO_2$ film 10 and the photosensitive resin films 11 and 12 laminated thereon, electrically isolates the wiring pattern 13 from the wiring pattern 14 which are connected to different potentials, and electrically isolates a wiring pattern 17 from a wiring pattern 18 which are connected to different potentials. Therefore, isolation between the wiring patterns connected to different potentials is improved.

That is, according to the present preferred embodiment, not only can the frequency temperature characteristic be improved by the $SiO_2$ film 10, which is formed to improve the frequency temperature characteristic, but the cost of the surface acoustic wave filter device can also be reduced by using a material chosen from a wide range of electrode materials and short circuiting between wiring patterns connected to different potentials can be prevented.

Furthermore, since such characteristics are obtained by performing only the above-mentioned steps, complicated manufacturing steps are not required.

FIGS. 5A to 5F and FIGS. 6A to 6F are cross-sectional elevation views showing the steps of a known method for obtaining a structure similar to that of the above-described preferred embodiment. Here, to facilitate understanding, components corresponding to those with reference numerals shown in FIGS. 3A to 3F and FIGS. 4A to 4F, which illustrate each step of the manufacturing method according to the above-described preferred embodiment, are denoted with reference numerals by adding 200 to the corresponding numerals used in FIGS. 3A to 3F and FIGS. 4A to 4F.

Figure 5A:
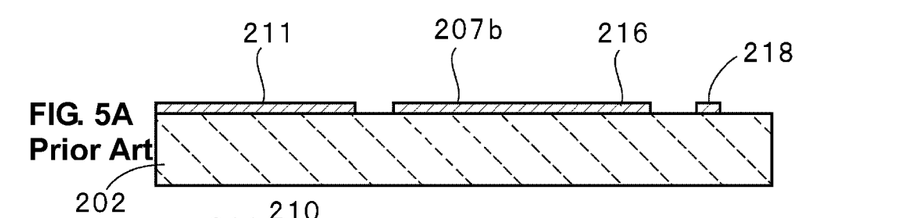
FIGS. 5A to 5F are elevational cross-sectional views illustrating an existing method for manufacturing the surface acoustic wave filter device as a comparative example.
Figure 5B:
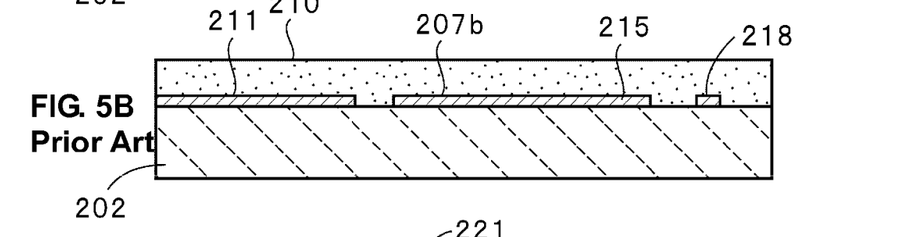

First, as shown in FIG. 5A, an IDT electrode 207b and wiring patterns 211, 216, and 217 are formed as a first layer electrode on a piezoelectric substrate 202. Then, as shown in FIG. 5B, a SiO$_2$ film 210 is formed and, as shown in FIG. 5B, a photoresist layer 221 is formed thereon. Up to this step, the known method includes steps that are similar to those of the above-described preferred embodiment.

Figures 5C, 5D:
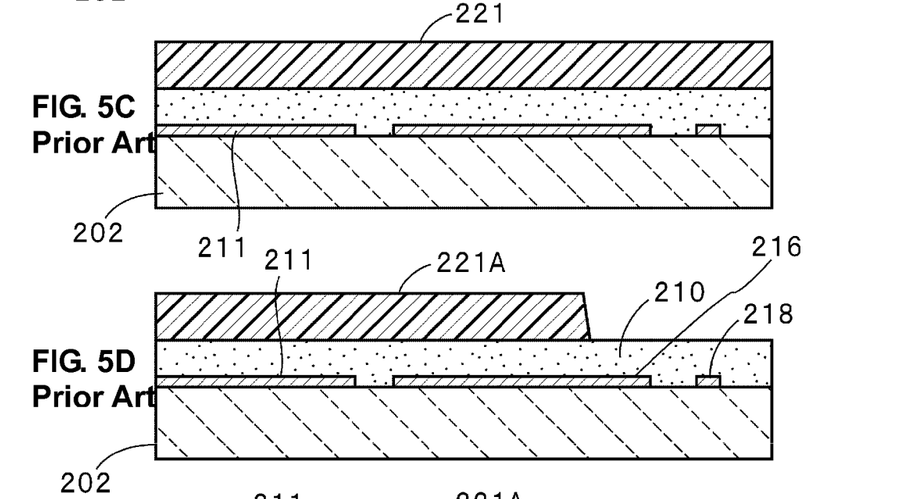
Figure 5E:
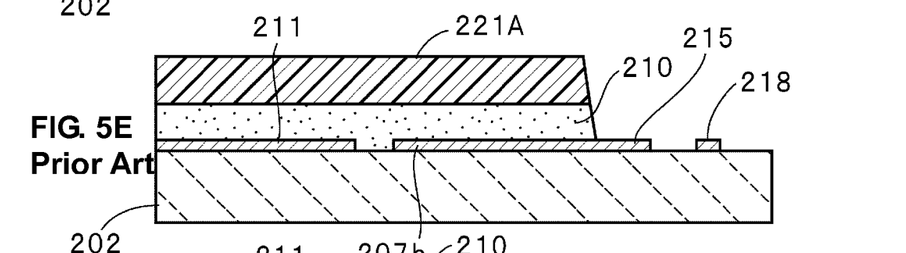
Figure 5F:
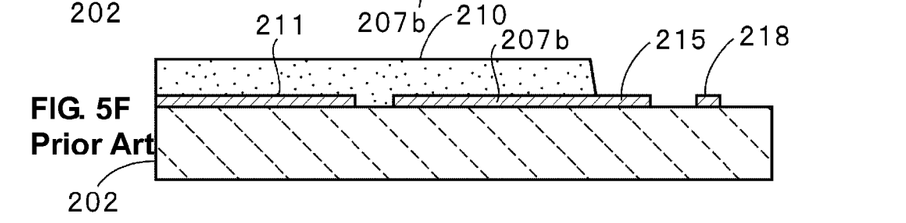

Next, as shown in FIG. 5D, the photoresist layer 221 is patterned by exposing and developing. Accordingly, a photoresist layer 221A and a region having no photoresist layer 221A are formed. Then, as shown in FIG. 5E, an exposed portion of the SiO$_2$ film 210 is removed and, as shown in FIG. 5F, the photoresist layer 221A is removed. Up to this step, the known method includes steps that are similar to those of the above-described preferred embodiment.

Figure 6A:
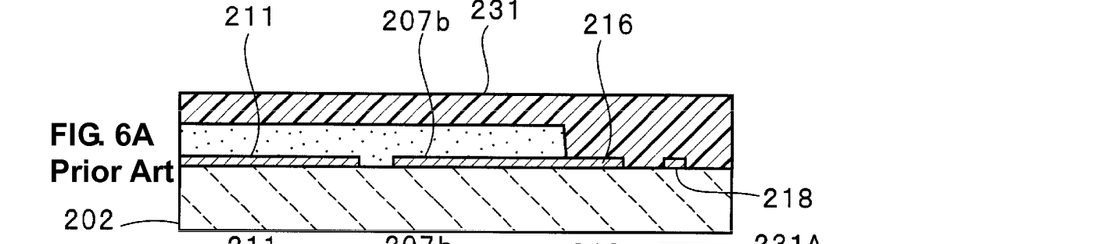
FIGS. 6A to 6F are elevational cross-sectional views illustrating an existing method for manufacturing the surface acoustic wave filter device as a comparative example.
Figure 6B:
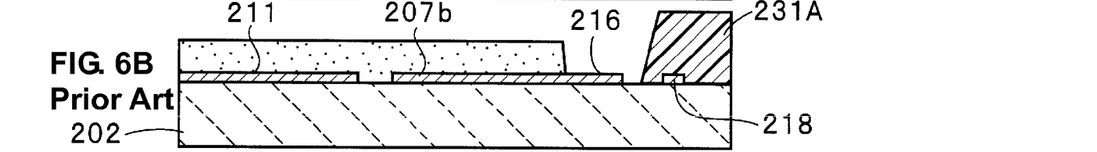

Next, as shown in FIG. 6A, a photosensitive resin layer 231 is formed on the entire surface and, as shown in FIG. 6B, the photosensitive resin layer 231 is removed by a lithography method so that only a photosensitive resin layer 231A remains. From the state shown in FIG. 6A to the state shown in FIG. 6B, exposing and developing should be performed.

Figure 6C:
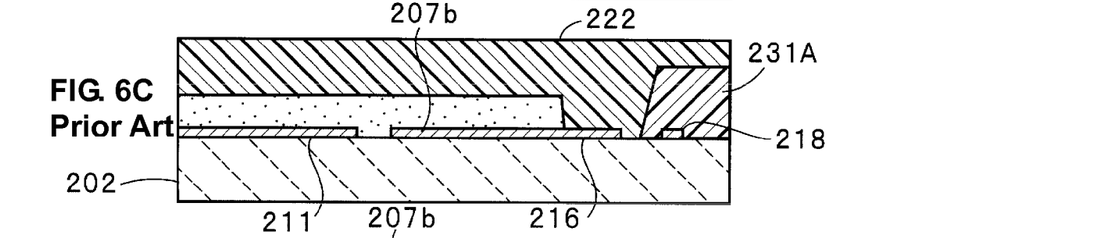
Figure 6D:
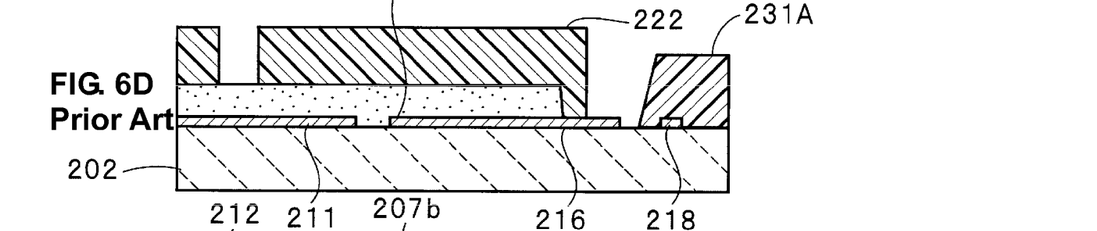
Figure 6E:
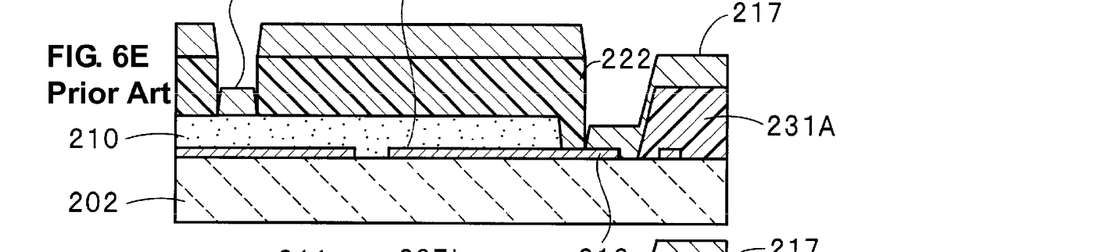
Figure 6F:
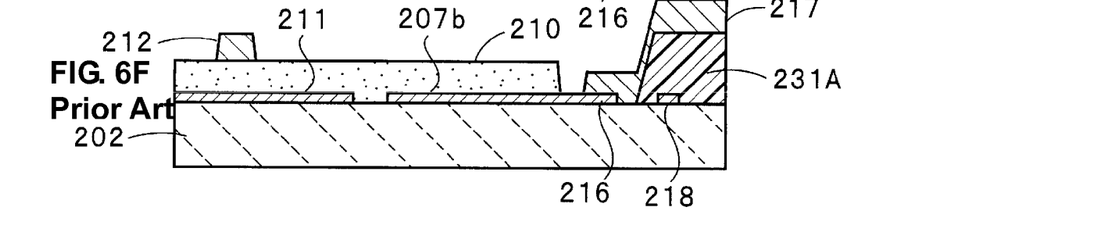

Then, as shown in FIG. 6C, a photoresist layer 222 is formed on the entire surface again and then, as shown in FIG. 6D patterning is performed and a second layer electrode material is applied to the entire surface as shown in FIG. 6E. Then, by using a lift-off technique, as shown in FIG. 6F, wiring patterns 212 and 217 are formed. Accordingly, a known surface acoustic wave device is obtained. In this case, not only patterning of the SiO$_2$ film but also forming and patterning of the photosensitive resin layer 231 are required. Therefore, the manufacturing steps are inherently complicated. Furthermore, for developing the photosensitive resin layer 231, a developer is required. Usually, the photosensitive resins of this type should be developed with an alkaline developer. Therefore, if Cu or other inexpensive electrode materials are used as a material for electrodes, corrosion of the electrodes is likely to occur.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A method for manufacturing a surface acoustic wave device comprising the steps of:
    forming an IDT electrode and a first wiring pattern on a piezoelectric substrate;
    forming an insulating film to cover the IDT electrode and the first wiring pattern on the piezoelectric substrate after the IDT electrode and the first wiring pattern are formed;
    applying a photosensitive resin on the insulating film so as to form a photosensitive resin layer;
    patterning the photosensitive resin layer;
    etching a portion of the insulating film such that the insulating film remains on the IDT electrode; and
    forming a second wiring pattern on the insulating layer composed of the insulating film and the photosensitive resin film provided on the insulating film in a region other than a region where the IDT electrode is provided.

2. The method for manufacturing the surface acoustic wave device according to claim 1, wherein the second wiring pattern is connected to a potential that is different from a potential to which the first wiring pattern is connected, and the first and the second wiring patterns are arranged such that the second wiring pattern is three-dimensionally crossed with the first wiring pattern with the insulating film interposed therebetween.

3. The method for manufacturing the surface acoustic wave device according to claim 1, further comprising the steps of:
    forming a third wiring pattern in the step of forming the IDT electrode and the first wiring pattern on the piezoelectric substrate;
    forming the insulating film so as to cover the third wiring pattern in the step of forming the insulating film covering the IDT electrode and the first wiring pattern;
    forming a hole in the insulating film so as to expose a portion of the third wiring pattern in the step of etching a portion of the insulating film; and
    forming a fourth wiring pattern electrically connected to the third wiring pattern in the hole and extended over the insulating layer composed of the insulating film around the hole on and the photosensitive resin film laminated on the insulating film.

4. The method for manufacturing the surface acoustic wave device according to claim 1, wherein the insulating film is a SiO$_2$ film.

5. The method for manufacturing the surface acoustic wave device according to claim 1, wherein the insulating film is formed to improve a frequency temperature characteristic thereof.

6. A surface acoustic wave device comprising:
    a piezoelectric substrate;
    at least one IDT electrode provided on the piezoelectric substrate;
    a first wiring pattern provided on the piezoelectric substrate;
    an insulating film arranged to cover the IDT electrode and the first wiring pattern; and
    a photosensitive resin film provided on the insulating film over the first wiring pattern but not on the IDT electrode; wherein
    a second wiring pattern is provided on the insulating layer having a laminated structure composed of the insulating film and the photosensitive resin film.

7. The surface acoustic wave device according to claim 6, wherein the second wiring pattern is connected to a potential that is different from a potential to which the first wiring pattern is connected, and the first and second wiring patterns are arranged so that the second wiring pattern is three-dimensionally crossed with the first wiring pattern with the insulating layer interposed therebetween.

8. The surface acoustic wave device according to claim 6, further comprising:
    a third wiring pattern provided on the piezoelectric substrate, wherein a portion of the third wiring pattern is exposed in a hole provided in the insulating film; and
    a fourth wiring pattern electrically connected to the third wiring pattern in the hole in the insulating film and extending over the insulating layer.

9. The surface acoustic wave device according to claim 6, wherein the insulating film is a SiO$_2$ film.

10. The surface acoustic wave device according to claim 6, wherein the insulating film is arranged to improve a frequency temperature characteristic thereof.

* * * * *